(12) United States Patent
Kim

(10) Patent No.: US 11,474,721 B2
(45) Date of Patent: Oct. 18, 2022

(54) STORAGE DEVICE MANAGING BAD BLOCK INFORMATION OF MEMORY BLOCKS AND OPERATING METHOD THEREOF

(71) Applicant: SK hynix Inc., Icheon-si (KR)

(72) Inventor: Dong Wook Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 86 days.

(21) Appl. No.: 16/918,689

(22) Filed: Jul. 1, 2020

(65) Prior Publication Data

US 2021/0141531 A1 May 13, 2021

(30) Foreign Application Priority Data

Nov. 7, 2019 (KR) .................... 10-2019-0141674

(51) Int. Cl.
*G06F 12/00* (2006.01)
*G06F 3/06* (2006.01)
(52) U.S. Cl.
CPC ............ *G06F 3/064* (2013.01); *G06F 3/0619* (2013.01); *G06F 3/0659* (2013.01); *G06F 3/0679* (2013.01)
(58) Field of Classification Search
CPC ...... G06F 3/064; G06F 3/0619; G06F 3/0659; G06F 3/0679; G06F 12/0246; G06F 2212/7209; G06F 13/1668; G06F 3/0655; G11C 2029/4402; G11C 16/0483; G11C 16/08; G11C 29/883; G11C 16/14; G11C 16/30
USPC ..................................................... 711/103
See application file for complete search history.

(56) References Cited

U.S. PATENT DOCUMENTS 10,073,622 B2\* 9/2018 Kim ...................... G06F 3/0608
10,289,480 B2\* 5/2019 Takeda ................... G11C 29/00
2019/0205043 A1\* 7/2019 Huang ................ G06F 12/1009

FOREIGN PATENT DOCUMENTS

KR 101460240 B1 11/2014
KR 101829861 B1 2/2018

\* cited by examiner

*Primary Examiner* — Mardochee Chery
(74) *Attorney, Agent, or Firm* — William Park & Associates Ltd.

(57) ABSTRACT

A storage device for preventing occurrence of a read fail has a reduced overhead. The storage device includes a memory device with a plurality of memory blocks; and a memory controller for managing a fail block and a shared block as bad blocks. The fail block is determined to be a bad block among the plurality of memory blocks. The shared block is a memory block that shares a control signal for selecting the fail block in the memory device.

17 Claims, 10 Drawing Sheets

| BLK | Shared BLK |
|-----|------------|
| BLK1 | BLK3 |
| BLK2 | BLK4 |
| BLK5 | BLK7 |
| BLK6 | BLK8 |
| ⋮ | ⋮ |

STORAGE DEVICE MANAGING BAD BLOCK INFORMATION OF MEMORY BLOCKS AND OPERATING METHOD THEREOF

CROSS-REFERENCE TO RELATED APPLICATION

The present application claims priority under 35 U.S.C. § 119(a) to Korean patent application number 10-2019-0141674, filed on Nov. 7, 2019, in the Korean Intellectual Property Office, the entire disclosure of which is incorporated herein by reference.

BACKGROUND

1. Technical Field

The present disclosure generally relates to an electronic device, and more particularly, to a storage device for preventing a read fail and an operating method thereof.

2. Related Art

A storage device is a device that stores data based on a host device, such as a computer or a smart phone. The storage device may include a memory device that stores data and a memory controller that controls the memory device. The memory device may be a volatile memory device or a nonvolatile memory device.

The volatile memory device is a memory device in which data is stored only when power is supplied, and the stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there is provided a storage device including: a memory device with a plurality of memory blocks; and a memory controller configured to manage a fail block and a shared block as bad blocks, wherein the fail block is determined to be a bad block among the plurality of memory blocks, and wherein the shared block is a memory block that shares a control signal for selecting the fail block in the memory device.

In accordance with another aspect of the present disclosure, there is provided a memory controller for controlling a memory device with a plurality of memory blocks, the memory controller comprising: a meta data storage with bad block information, the bad block information being information on a bad block among the plurality of memory blocks; and a bad block manager configured to manage at least one of a fail block, determined to be a bad block among the plurality of memory blocks, and configured to manage a shared block as a memory block that shares a control signal for selecting the fail block in the memory device.

In accordance with still another aspect of the present disclosure, there is provided a storage device including: a memory device configured to include a plurality of memory blocks, configured to perform an operation corresponding to a received operation command on a selected memory block among the plurality of memory blocks, and configured to output a result that is obtained by performing the operation; and a memory controller configured to manage at least one of the selected memory block and a shared block as bad blocks, wherein the shared block is a memory block that shares a block word line with the selected memory block based on the result that is obtained by performing the operation.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

Embodiments provide a storage device for preventing a read fail and an operating method thereof.

Figure 1:
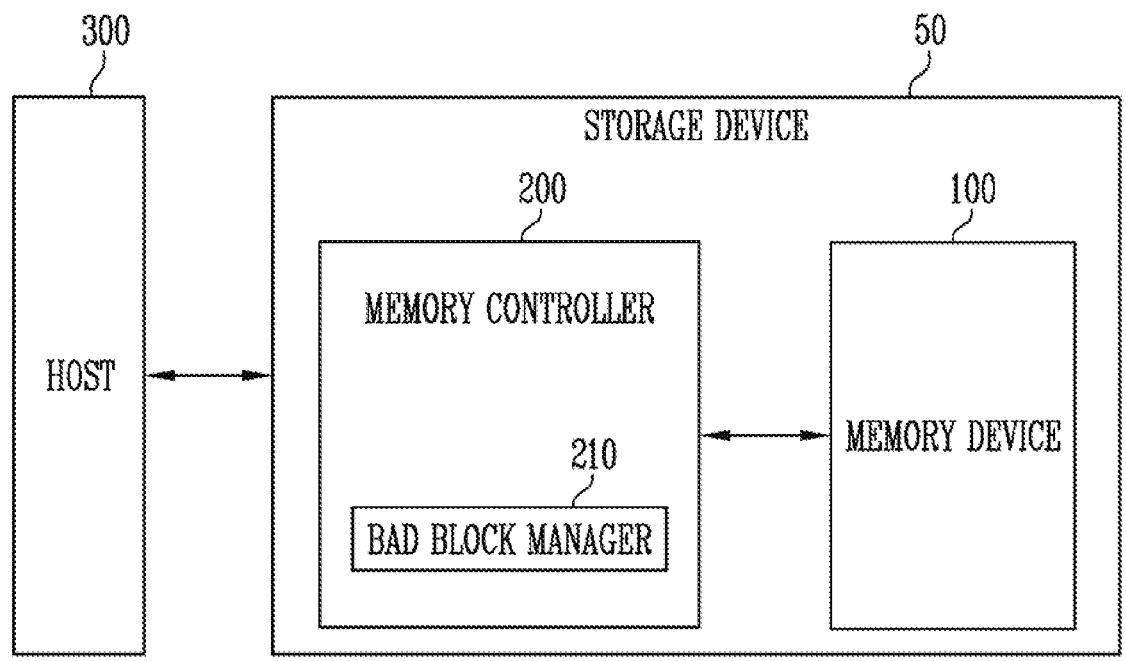
FIG. 1 is a block diagram, illustrating a configuration of a storage device, in accordance with an embodiment of the present disclosure.

FIG. 1 is a block diagram, illustrating a configuration of a storage device, in accordance with an embodiment of the present disclosure.

Referring to FIG. 1, the storage device 50 may include a memory device 100 and a memory controller 200.

The storage device 50 may be a device that stores data based on a host 300, such as a mobile phone, a smart phone, an MP3 player, a laptop computer, a desktop computer, a game console, a TV, a tablet PC or an in-vehicle infotainment.

The storage device 50 may be manufactured as any one of the various types of storage devices based on a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types, such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate based on the memory controller 200. The memory device 100 may include a plurality of planes. The plane may be an area which can operate independently. Each plane may independently perform any one operation among a program operation, a read operation, and an erase operation.

The memory device 100 may include a memory cell array with a plurality of memory cells for storing data. The memory cell array may include a plurality of memory blocks. The memory block may include a plurality of memory cells. The memory block may be a unit of measurement for performing an erase operation that erases stored data in the memory device 100. That is, the stored data in the same memory block may be simultaneously erased. In an embodiment, the memory block may include a plurality of pages. A page may be a unit of measurement for storing data in the memory device 100 or reading data that is stored in the memory device 100. That is, a physical address, which the memory controller 200 provides to the memory device 100 in a program operation or a read operation, may be an address for identifying a specific page.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

In an embodiment, the memory device 100 may be implemented in a three-dimensional array structure. The present disclosure may be applied to not only a flash memory device in which a charge storage layer is configured with a Floating Gate (FG), but also a Charge Trap Flash (CTF) in which a charge storage layer is configured with an insulating layer.

In an embodiment, each of the memory cells included in may operate as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory controller 200 may control overall operations of the storage device 50. When a power voltage is applied to the storage device 50, the memory controller 200 may execute firmware (FW). When the memory device 100 is a flash memory device, the memory controller 200 may execute FW, such as a Flash Translation Layer (FTL) for controlling the communication between the host 300 and the memory device 100.

When a write request is input from the host 300, the memory controller 200 may receive write data to be stored in the memory device 100 and a Logical Address (LA) to identify the corresponding write data, which are input from the host 300. The memory controller 200 may translate the input LA into a Physical Address (PA) that represents a physical address of memory cells in which write data is to be stored among the memory cells included in the memory device 100. In an embodiment, one physical address may correspond to one physical page. The memory controller 200 may provide the memory device 100 with a program command for storing data, a PA, and write data.

In an embodiment, when a read request is input from the host 300, the memory controller 200 may receive an LA that corresponds to the read request from the host 300. The LA that corresponds to the read request may be an LA for identifying read-requested data. The memory controller 200 may acquire a PA that is mapped to the LA, corresponding to the read request from the map data, representing a corresponding relationship between an LA provided by the host 300 and a PA of the memory device 100. Subsequently, the memory controller 200 may provide the memory device 100 with a read command and a PA. In various embodiments, in an erase operation, the memory controller 200 may provide the memory device 100 with an erase command and a physical block address of a memory block to be erased.

In an embodiment, the memory controller 200 may control the memory device 100 to autonomously perform a program operation, a read operation, or an erase operation, regardless of the request from the host 300. For example, the memory controller 200 may control the memory device 100 to perform background operations, such as wear leveling, garbage collection, and read reclaim.

The memory controller 200 may further include a bad block manager 210.

The bad block manager 210 may manage bad blocks among a plurality of memory blocks that are included in the memory device 100. The bad block manager 210 may store information of bad blocks and may manage the bad blocks such that data is prevented from being stored in the bad blocks. The bad block may be divided into a manufacture bad block, which is a bad block that is detected by a test during a manufacturing process, and a growing bad block, which is a bad block that is generated during the use of the memory device 100. Information regarding the manufacture bad blocks is stored in the memory device 100. When power is applied to the storage device 50, the memory controller 200 may load information on manufacture bad blocks and may manage the manufacture bad blocks so that the manufacture bad blocks are not allocated for a write operation.

The growing bad block may be a memory block in which a failure has occurred when the memory device 100 is used. The number of growing bad blocks may increase as the period in which the memory device 100 is used increases. The growing bad block may be a block in which any data cannot be stored or in which stored data cannot be relied upon. The growing bad block may be detected by the failure of an operation.

The bad block manager 210 may manage a memory block in which a program operation has failed, a memory block in which an erase operation has failed, or a memory block in which a read operation has failed. When a memory block is determined to be a bad block, the bad block manager 210 may move valid data that is stored in the corresponding memory block to a new memory block.

In an embodiment, when any one memory block among the memory blocks, included in the memory device 100, is a bad block based on a connection relationship of the memory blocks, it will be highly likely that a memory block in a specific connection relationship with the bad block will also be a bad block.

When a specific memory block is determined to be a bad block, the bad block manager 210 may determine the memory block in a specific connection relationship to be a bad block. In an embodiment, a memory block, having a specific connection relationship with the bad block, may be a shared block.

In an embodiment, the bad block manager 210 may perform a test program operation to determine the state of a bad block in a memory block that is determined to be the bad block and may manage the shared block as a bad block when the bad block's degree of failure is severe. Alternatively, the bad block manager 210 might not manage the shared block when the bad block's degree of failure is not severe. A detailed operation of the bad block manager 210 will be described in more detail later with reference to FIG. 5.

The host 300 may communicate with the storage device 50 by using at least one of the various communication interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
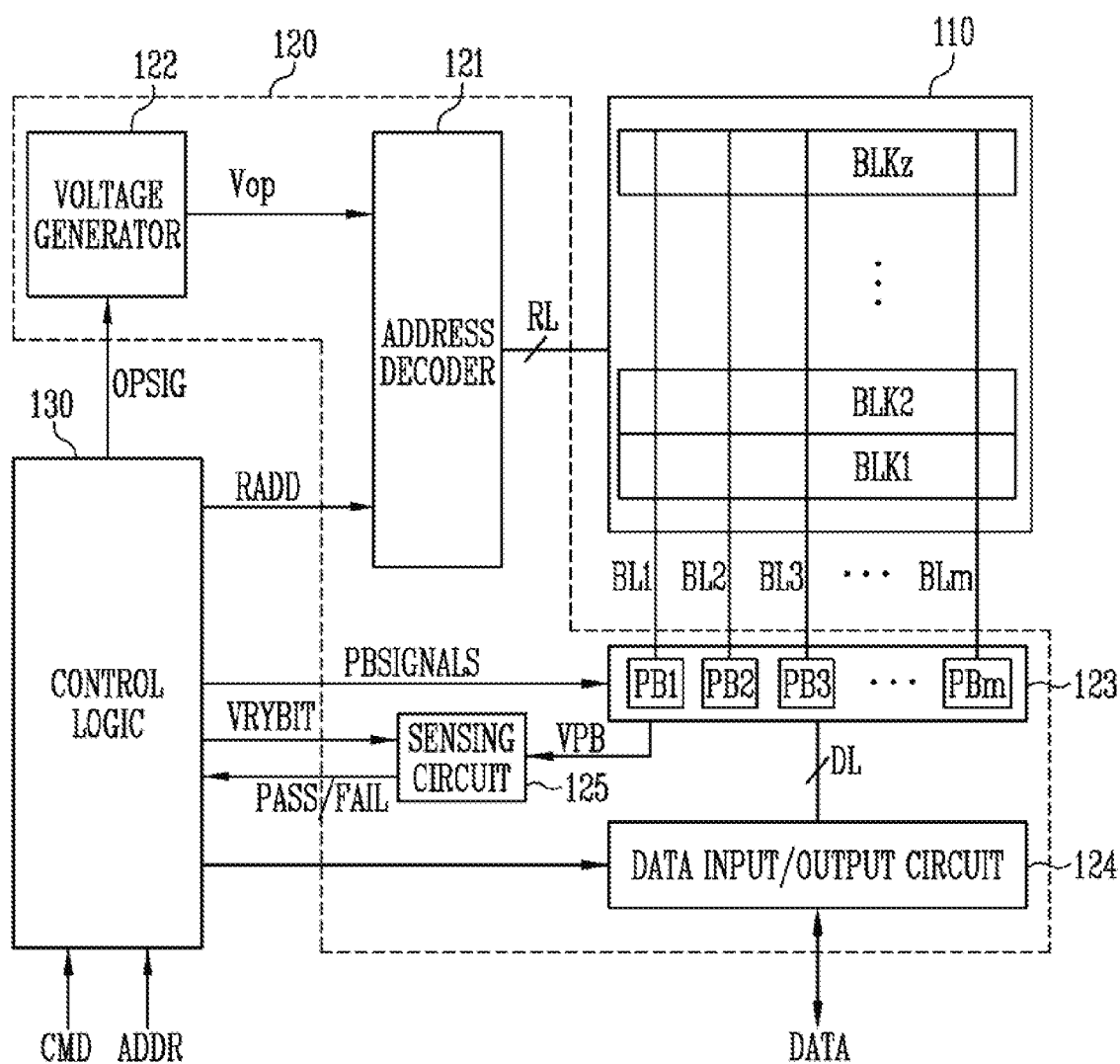
FIG. 2 is a diagram, illustrating a structure of a memory device shown in FIG. 1.

FIG. 2 is a diagram, illustrating a structure of the memory device shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a read/write circuit 123 through bit lines BL1 to BLm. Each of the plurality of memory blocks BLK1 to BLKz may include a plurality of memory cells. In an embodiment, the plurality of memory cells may be nonvolatile memory cells. Memory cells that are connected to the same word line among the plurality of memory cells may be defined to constitute one physical page. Therefore, one memory block may include a plurality of physical pages. One memory cell that is included in the memory block may be configured as a Single Level Cell (SLC) that stores one-bit data, a Multi-Level Cell (MLC) that stores two-bit data, a Triple Level Cell (TLC) that stores three-bit data, or a Quad Level Cell (QLC) that stores four-bit data.

The peripheral circuit 120 may include the address decoder 121, a voltage generator 122, the read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, and an erase operation.

The voltage generator 122 may generate a plurality of operating voltages Vop by using an external power voltage that is supplied to the memory device 100. The voltage generator 122 may operate based on the control logic 130. Specifically, the voltage generator 122 may generate operating voltages Vop that are used for a program operation, a read operation, and an erase operation in response to an operation signal OPSIG. For example, the voltage generator 122 may generate a program voltage, a verify voltage, a program pass voltage, a verify pass voltage, a read voltage, an erase voltage, and the like based on the control logic 130.

In an embodiment, the voltage generator 122 may include a plurality of pumping capacitors in order to generate a plurality of operating voltages Vop with various voltage levels. The voltage generator 122 may generate the plurality of operating voltages Vop by selectively activating the plurality of pumping capacitors based on the control logic 130. The plurality of generated voltages Vop may be supplied to the memory cell array 110 by the address decoder 121.

The address decoder 121 may be connected to the memory cell array 110 through the row lines RL. The row lines RL may include drain select lines, word lines, source select lines, and a common source line. In various embodiments, the word lines may include normal word lines and dummy word lines. In addition, the row lines RL may further include a pipe select line.

The address decoder 121 may operate based on the control logic 130. The address decoder 121 may transfer the operating voltages Vop that are generated by the voltage generator 122 to the row lines RL, connected to a selected memory block among the plurality of memory blocks BLK1 to BLKz, in response to a row address RADD from the control logic 130.

The read/write circuit 123 may include first to mth page buffers PB1 to PBm. The first to mth page buffers PB1 to PBm may be connected to the memory cell array 110, respectively, through first to mth bit lines BL1 to BLm. The first to mth page buffers PB1 to PBm may operate based on the control logic 130. For example, the first to mth page buffers PB1 to PBm may operate in response to page buffer control signals PBSIGNALS.

In an embodiment, the first to mth page buffers PB1 to PBm may sense voltages or currents of the first to mth bit lines BL1 to BLm to sense data that is stored in the memory cell array 110. The first to mth page buffers PB1 to PBm may temporarily store the sensed data. The first to mth page buffers PB1 to PBm may provide the sensed data to the data input/output circuit 124 through data lines DL.

In an embodiment, the first to mth page buffers PB1 to PBm may receive data to be stored through the data lines DL from the data input/output circuit 124. When a program operation is performed, the data that is received by the first to mth page buffers PB1 to PBm may be stored in the memory cell array 110.

A program operation for storing data in a memory cell may include a program voltage application phase and a verify phase. In the program voltage application phase, when a program voltage is applied to a selected word line, the first to mth page buffers PB1 to PBm may transfer data to be stored to selected memory cells. A memory cell that is connected to a bit line to which a program voltage (e.g., a ground voltage) is applied may have an increased threshold voltage. A threshold voltage of a memory cell, connected to a bit line to which a program inhibit voltage (e.g., a power voltage) is applied, may be maintained. In the verify phase of verifying the program operation, the first to mth page buffers PB1 to PBm may sense the data that is stored in the selected memory cells through bit lines BL1 to BLm that is connected to the selected memory cells.

In the verify phase, the sensing circuit 125 may generate a reference current in response to an allow bit VRYBIT and may output a pass signal PASS or a fail signal FAIL by comparing a sensing voltage VPB received from the read/write circuit 123 with a reference voltage that is generated by the reference current.

The data input/output circuit 124 may be connected to the first to mth page buffers PB1 to PBm through the data lines DL. The data input/output circuit 124 may operate based on the control logic 130.

The data input/output circuit 124 may transfer a command CMD and an address ADDR, which are received from the memory controller 200 as shown in FIG. 1, to the control logic 130 or may provide the data DATA to the read/write circuit 123 that is received from the memory controller 200 as shown in FIG. 1.

In an embodiment, the data input/output circuit 124 may include a plurality of input/output buffers (not shown) that receive data DATA. In a program operation, the data input/output circuit 124 may receive data DATA to be stored from the memory controller 200. In a read operation, the data input/output circuit 124 may output, to the memory controller 200, data that is transferred from the first to mth page buffers PB1 to PBm, included in the read/write circuit 123.

The control logic 130 may be connected to the address decoder 121, the voltage generator 122, the read/write circuit 123, the data input/output circuit 124, and the sensing circuit 125. The control logic 130 may control the overall operations of the memory device 100. The control logic 130 may generate a plurality of control signals to control the peripheral circuit 120 in response to the command CMD and the address ADDR. For example, the control logic 130 may generate the operation signal OPSIG, the row address RADD, the page buffer control signals PBSIGNALS, and the allow bit VRYBIT in response to the command CMD and the address ADDR. The control logic 130 may determine whether a verify operation has passed or failed based on the pass or fail signal PASS/FAIL output from the sensing circuit 125.

Figure 3:
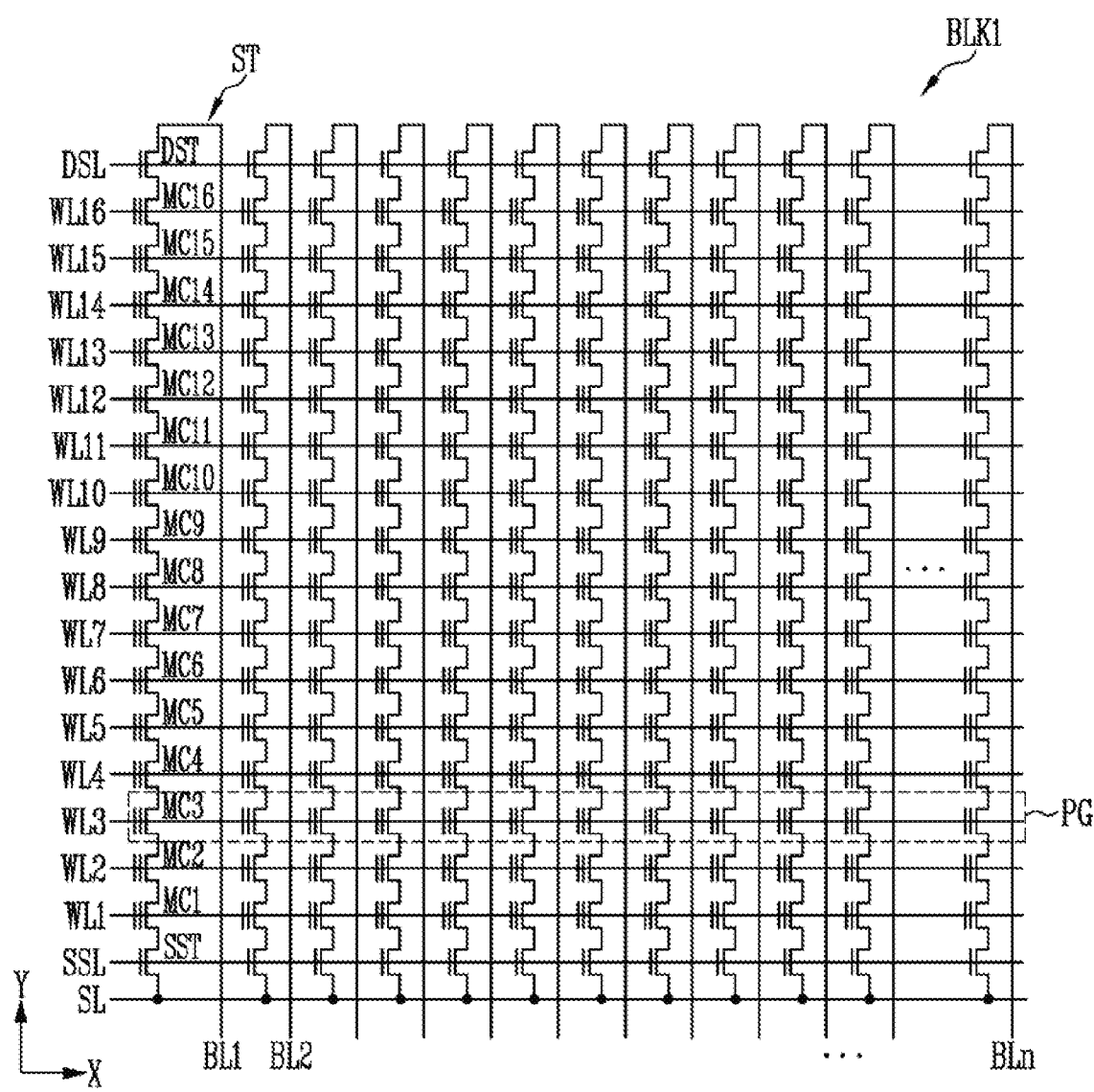
FIG. 3 is a diagram, illustrating a structure of any one memory block among memory blocks shown in FIG. 2.

FIG. 3 is a diagram, illustrating a structure of any one memory block BLK1 among the memory blocks BLK1 to BLKz, shown in FIG. 2.

Referring to FIG. 3, in the memory block BLK1, a plurality of word lines may be arranged, in parallel to each other, between a first select line and a second select line. The first select line may be a source select line SSL, and the second select line may be a drain select line DSL. More specifically, the memory block BLK1 may include a plurality of strings ST that are connected between bit lines BL1 to BLn and a source line SL. The bit lines BL1 to BLn, shown in FIG. 3, may be the first to mth bit lines BL1 to BLm, shown in FIG. 2. The bit lines BL1 to BLn may be respectively connected to the strings ST, and the strings ST may be commonly connected to the source line SL. The strings ST may be configured identically to one another, and therefore, a string ST that is connected to a first bit line BL1 will be described in detail as an example.

The string ST may include a source select transistor SST, a plurality of memory cells MC1 to MC16, and a drain select transistor DAT, which are connected, in series to each other, between the source line SL and the first bit line BL1. In another embodiment, at least one source select transistor SST and at least one drain select transistor DST may be included in one string ST, and more than 16 memory cells (shown in the drawing) may be included in the one string ST.

A source of the source select transistor SST may be connected to the source line SL, and a drain of the drain select transistor DAT may be connected to the first bit line BL1. The memory cells MC1 to MC16 may be connected, in series, between the source select transistor SST and the drain select transistor DST. The gates of source select transistors SST that are included in different strings ST may be connected to the source select line SSL, and the gates of drain select transistors DST that are included in different strings ST may be connected to the drain select line DSL. The gates of the memory cells MC1 to MC16 may be connected to a plurality of word lines WL1 to WL16. A group of memory cells that are connected to the same word line, among memory cells included in different strings ST, may be referred to as a physical page PG. Therefore, physical pages PG that correspond to the number of the word lines WL1 to WL16 may be included in the memory block BLK1. In FIG. 3, the source line SL, the source select line SSL, the word lines WL1 to WL16, and the drain select line DSL may be included in the row lines RL as shown in FIG. 2.

When one memory cell is a Single Level Cell (SLC) that stores one-bit data, one physical page PG may store one logical page (LPG) data. In addition, one memory cell may store two or more-bit data. In other words, one physical page PG may store two or more LPG data.

Figure 4:
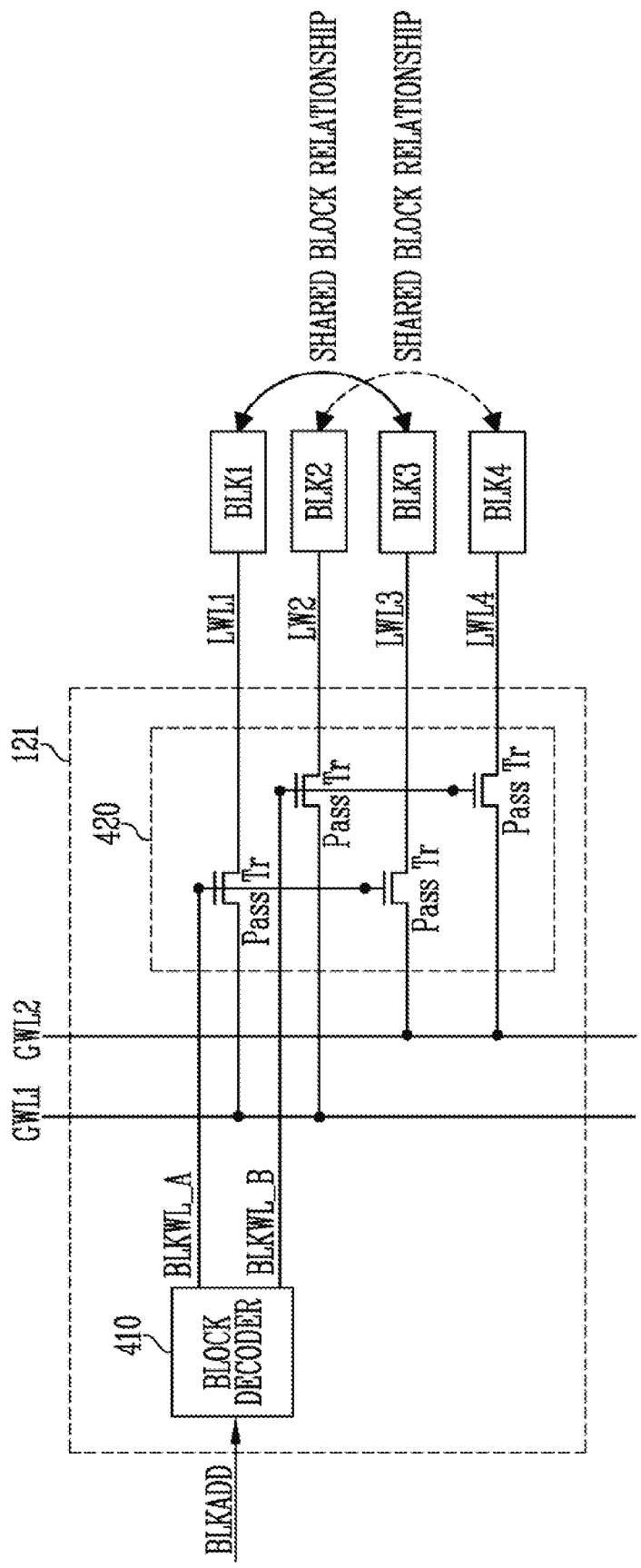
FIG. 4 is a diagram, illustrating a connection relationship between an address decoder and a memory cell array, which are shown in FIG. 2.

FIG. 4 is a diagram, illustrating a connection relationship between the address decoder 121 and the memory cell array 110, which are shown in FIG. 2.

Referring to FIG. 4, the address decoder 121 may be a shared block decoder. The shared block decoder may be a decoder that allows at least two memory blocks to share a block select signal for selecting a memory block.

In FIG. 4, for the purposes of the embodiment, it is assumed that any one of the memory blocks among the first to fourth memory blocks BLK1 to BLK4 is selected.

The address decoder 121 may include a block decoder 410 and a block connector 420.

The block decoder 410 may receive a block address signal BLKADD. The block address signal BLKADD may be included in the row address RADD that is described with reference to FIG. 2. The block decoder 410 may generate a block select signal to select a memory block by decoding the block address signal BLKADD. The block decoder 410 may provide the generated block select signal to the block connector 420 through block word lines BLKWL_A and BLKWL_B.

The block connector 420 may connect global word lines GWL1 and GWL2 to local word lines LWL1 to LWL4 or release the connection in response to the block select signal that is provided through the block word lines BLKWL_A and BLKWL_B. The global word lines GWL1 and GWL2 may be lines through which the operating voltages Vop, generated by the voltage generator 122 that is described with reference to FIG. 2, are provided.

The block connector 420 may include a plurality of sub-connectors, respectively corresponding to a plurality of memory blocks. In an embodiment, the sub-connector may be a pass transistor. Each of the block word lines BLKWL_A and BLKWL_B may be commonly connected to at least two sub-connectors. For example, an A block word line BLKWL_A may be connected to gate electrodes of pass transistors that correspond to the first memory block BLK1 and the third memory block BLK3. A B block word line BLKWL_B may be connected to gate electrodes of pass transistors that correspond to the second memory block BLK2 and the fourth memory block BLK4. This is referred to as a shared block decoder structure. According to the shared block decoder structure, the block word lines BLKWL_A and BLKWL_B may be commonly connected to sub-connectors that correspond to at least two memory blocks. Thus, the shared block decoder structure is used so that the area of the address decoder 121 may be decreased.

For the purposes of the embodiment, it is assumed that a command for performing an operation on the first memory block BLK1 is input.

The voltage generator 122 may generate and output operating voltages to the first memory block BLK1 as a selected memory block and may provide the generated voltages to a first global line GWL1. The voltage generator 122 may generate and output operating voltages to the unselected memory blocks and may provide the generated voltages to a second global word line GWL2.

The block decoder 410 may receive a block address signal BLKADD that indicates the first memory block BLK1. The block decoder 410 may provide a block select signal, in an enable state, to the A block word line BLKWL_A that is connected to a sub-connector, corresponding to the first memory block BLK1, and may provide a block select signal, in a disable state, to the B block word line BLKWL_B that is connected to a sub-connector, corresponding to the second memory block BLK2 and the fourth memory block BLK4.

The pass transistors, corresponding to the first memory block BLK1 and the third memory block BLK3, which receive the block select signal in the enable state, may be turned on. The pass transistors, corresponding to the second memory block BLK2 and the fourth memory block BLK4, which receive the block select signal in the disable state, may be turned off. The third memory block BLK3 may share the block word line with the first memory block BLK1, but the operating voltages to be provided to the unselected memory blocks may be applied to the second global word line GWL2 to which the third memory block BLK3 is connected. Therefore, only the first memory block BLK1 may be provided with the operating voltages to be applied to the selected memory block.

Since the first memory block BLK1 and the third memory block BLK3 share the block word line, the first memory block BLK1 and the third memory block BLK3 may have a shared block relationship. A shared block may be a memory block which shares a block word line. That is, a shared block of the first memory block BLK1 may be the third memory block BLK3, and a shared block of the third memory block BLK3 may be the first memory block BLK1. In the same manner, a shared block of the second memory block BLK2 may be the fourth memory block BLK4, and a shared memory block of the fourth memory block BLK2 may be the second memory block BLK2.

In the shared block decoder structure, memory blocks share a block word line. Hence, when a failure occurs, such as when a bridge is generated in a specific block word line during the use of the memory device 100, it will be highly likely that an operation on the shared blocks, corresponding to the specific block word line, will fail.

Thus, in the embodiment of the present disclosure, a storage device and an operating method thereof is provided in which, when a specific memory block is determined to be a growing bad block, a shared block of the corresponding memory block is also managed as a bad block so that a situation in which data cannot be recovered according to read fail can be prevented in advance.

Figure 5:
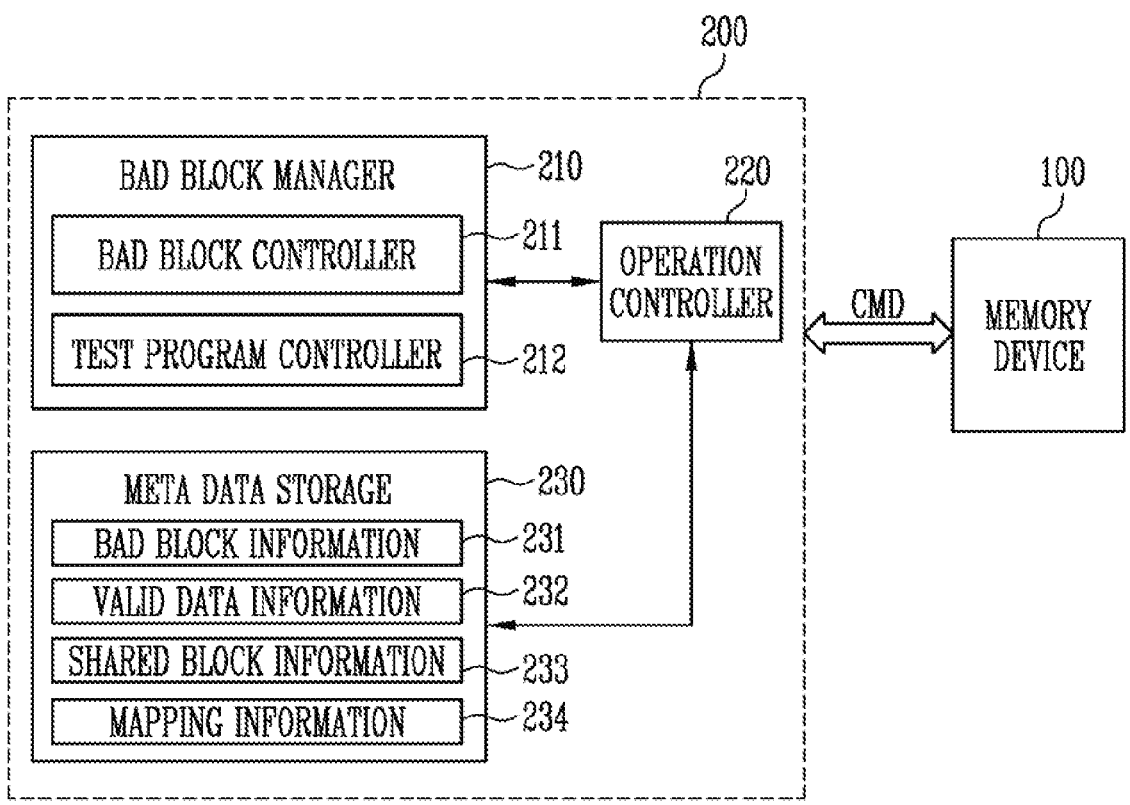
FIG. 5 is a diagram, illustrating an operation of a memory controller shown in FIG. 1.

FIG. 5 is a diagram, illustrating an operation of the memory controller, shown in FIG. 1.

Referring to FIG. 5, the memory controller 200 may include a bad block manager 210, an operation controller 220, and a meta data storage 230.

The operation controller 220 may control the memory device 100 to perform a program operation, a read operation, or an erase operation. The operation controller 220 may provide the memory device 100 with a command, an address, or data, and may determine whether the result of the operation that is performed by the memory device 100 is a pass or a fail. For example, in the case of a program operation or an erase operation, it may be determined whether the operation is a pass or a fail from the status information that is provided from the memory device 100. In the case of a read operation, the read operation may be a pass when the error correction decoding on read data that is provided from the memory device 100 succeeds. The read operation may be a fail when the error correction decoding fails.

When an operation is determined to have failed, the operation controller 220 may provide the bad block manager 210 with information on the memory block in which the operation failed.

The bad block manager 210 may include a bad block controller 211 and a test program controller 212. In addition, the meta data storage 230 may include bad block information 231, valid data information 232, shared block information 233, and mapping information 234.

The bad block information 231 may include information on a physical address of a bad block.

The valid data information 232 may be information that represents whether data that is stored in the memory blocks, included in the memory device 100, is valid data or invalid data. When a write request for a logical address of data, which has already been stored in the memory device 100, is input, previously stored data may be handled as invalid data, and newly write-requested data may be managed as valid data.

The shared block information 233 may include information regarding the shared relationship between the memory blocks that are included in the memory device 100. Specifically, the shared block information 233 may include a physical address of a memory block and its shared block with a shared relationship. The shared relationship may be a relationship in which the same block word line is shared.

The mapping information 234 may include mapping information between logical and physical addresses of data that is stored in the memory device 100.

When a bad block is generated, the bad block controller 211 may copy data that is stored in the bad block and a shared block of the bad block to another memory block. Specifically, the bad block controller 211 may read valid data that is stored in the bad block and the shared block based on the valid data information 232 and the shared block information 233, and may request the operation controller 220 to store the read valid data in another memory block. When the position of data is changed, the bad block controller 211 may update the mapping information 234 based on information on the changed physical address. The bad block controller 211 may control the meta data storage 230 to store information on at least one of the bad block and the shared block in the meta data storage 230. Specifically, the bad block controller 211 may update the bad block information 231 based on the information on at least one of the bad block and the shared block.

In an embodiment, the memory controller 200 might not unconditionally manage the shared block as a bad block and may selectively manage the shared block as the bad block based on the failure degree of the failed memory block.

For example, the test program controller 212 may copy the data that is stored in a bad block and a shared block of the bad block to another memory block and then may request the operation controller 220 to perform an erase operation on the bad block. After the erase operation is performed, the test program controller 212 may request the operation controller 220 to store the test program data in the erased bad block.

In an embodiment, the erase operation on the bad block may fail. When the failure of the bad block occurs to a degree to which a test program operation cannot be performed, the test program controller 212 may manage the shared block as a bad block.

When the test program operation on the bad block is completed, the test program controller 212 may selectively manage the shared block as the bad block based on the result obtained by performing the test program operation. When the failure degree of the bad block exceeds a certain level, the test program controller 212 may also manage the shared block as the bad block. When the failure degree of the bad block is less than or equal to the certain level, the test program controller 212 might not manage the shared block as the bad block.

Specifically, the test program controller 212 may determine whether the number of physical pages in which a program operation has failed (or a number of word lines) exceeds a predetermined reference value, based on the result obtained by performing the test program operation. The failure of a program operation may be a case where a number of program loops exceeds a maximum program loop number, a case where verification finally fails, a case where a number of times a program pulse is applied exceeds a predetermined number of times, etc. The predetermined reference value may be experimentally acquired in a test phase of the memory device 100, and may be pre-stored in the memory device 100.

Figure 6:
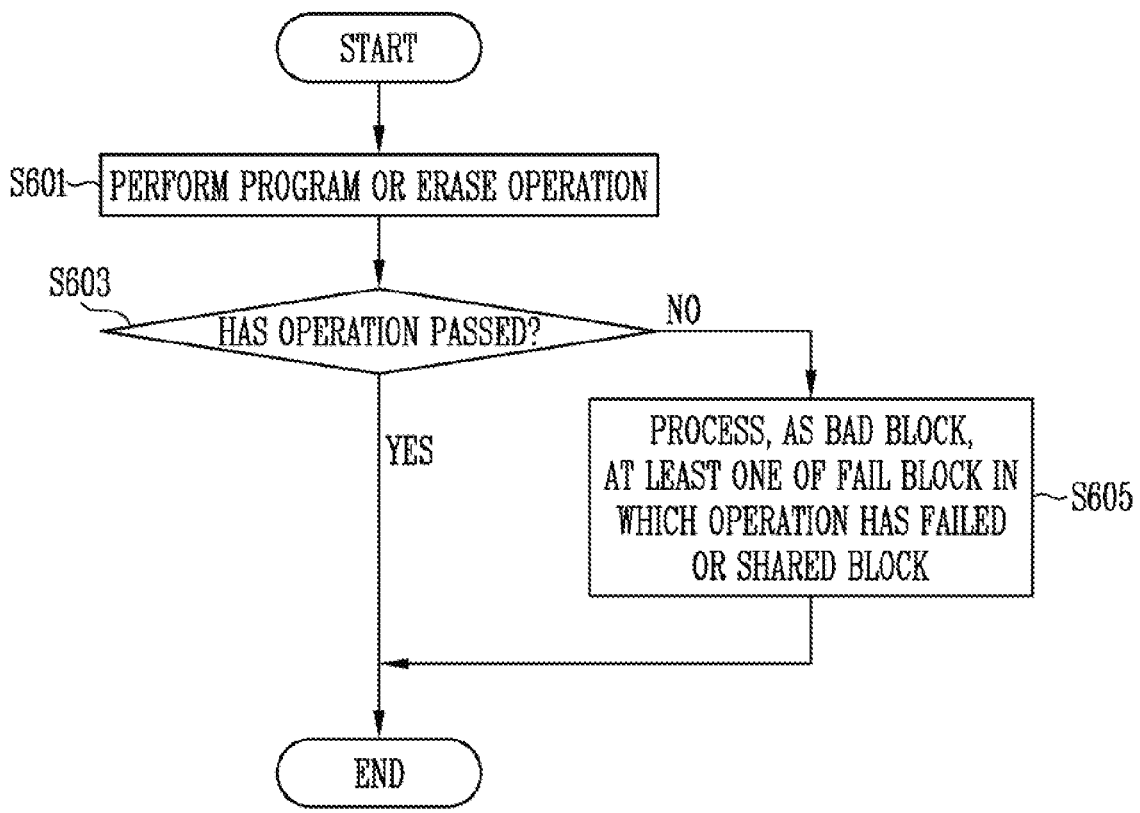
FIG. 6 is a flowchart, illustrating an operation of the storage device, in accordance with an embodiment of the present disclosure.

FIG. 6 is a flowchart, illustrating an operation of the storage device, in accordance with an embodiment of the present disclosure.

Referring to FIG. 6, in step S601, the storage device may perform any one of a program operation or an erase operation. Specifically, the memory device may perform the program operation or the erase operation based on the memory controller and may provide the memory controller with a result that is obtained by performing the program operation or the erase operation.

In step S603, the storage device may determine whether the operation that is performed in the step S601 has failed. When the operation passes as a determination result, the operation ends. When the operation fails as a determination result, the operation proceeds to step S605.

In step S605, the storage device may process, as a bad block, at least one of the memory blocks in which the operation has failed and a shared block of the corresponding memory block.

Figure 7:
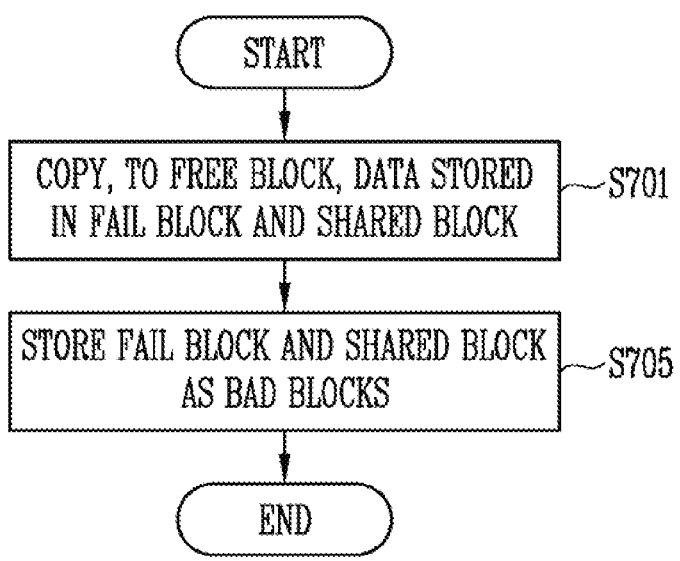
FIG. 7 is a flowchart, illustrating an operation of the storage device, in accordance with another embodiment of the present disclosure.

FIG. 7 is a flowchart, illustrating an operation of the storage device, in accordance with another embodiment of the present disclosure. FIG. 7 illustrates in more detail step S605 of FIG. 6.

Referring to FIG. 7, in step S701, the storage device may copy, to another memory block, data that is stored in a fail block in which an operation has failed and a shared block of the fail block. The shared block may share a control signal that selects the fail block in the memory device.

In step S703, the storage device may manage the fail block and the shared block to prevent the use of the blocks by storing both the fail block and the shared block as bad blocks.

Figure 8:
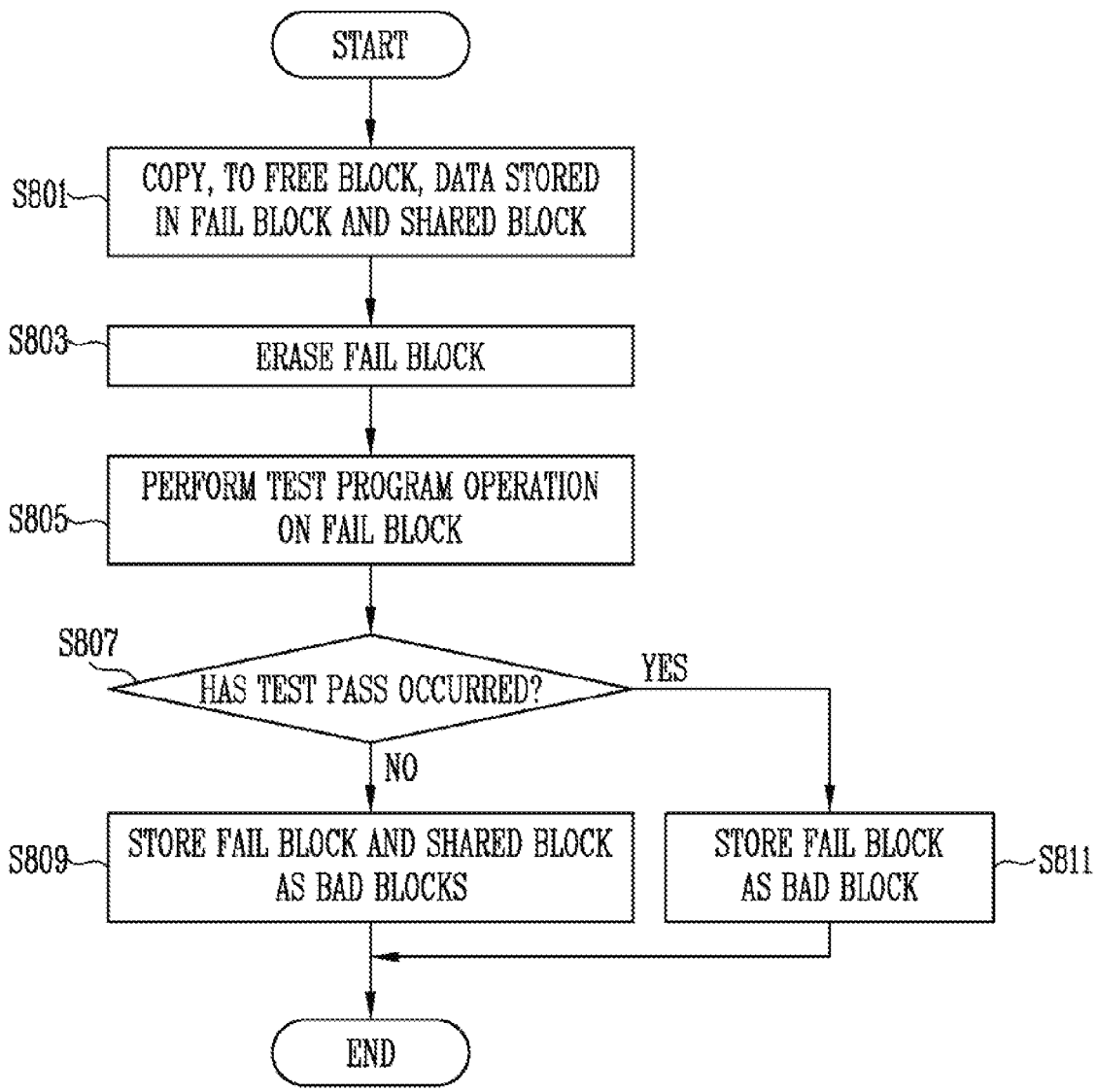
FIG. 8 is a flowchart, illustrating an operation of the storage device, in accordance with another embodiment of the present disclosure.

FIG. 8 is a flowchart, illustrating an operation of the storage device, in accordance with another embodiment of the present disclosure. FIG. 8 is a diagram, illustrating another embodiment of step S605 of FIG. 6. Unlike the case shown in FIG. 7, the embodiment of FIG. 8 is an embodiment in which a shared block is selectively stored as a bad block based on the state of the fail block.

Referring to FIG. 8, in step S801, the storage device may copy, to another memory block, data that is stored in a fail block in which an operation has failed and a shared block of the fail block.

In step S803, the storage device may perform an erase operation on the fail block. Although not shown in FIG. 8, the erase operation on the fail block may fail. The storage device may proceed to step S809 and may manage both the fail block and the shared block as bad blocks.

In step S805, the storage device may perform a test program operation on the fail block.

In step S807, the storage device may determine test pass or test fail of the fail block based on a result that is obtained by performing the test program operation on the fail block.

The test pass or test fail may be determined based on whether the number of word lines in which the test program operation has failed among a plurality of word lines that are included in the fail block exceeds a predetermined reference number. When the number of word lines in which the test program operation has failed exceeds the reference number from performing the test program operation on the fail block, a test fail may occur. On the contrary, when the number of word lines in which the test program operation has failed is less than or equal to the reference number, a test pass may occur. When the test pass occurs, the storage device may proceed to step S811. When the test fail occurs, the storage device may proceed to the step S809.

In the step S809, the storage device may manage both the fail block and the shared block as bad blocks.

In the step S811, the storage device may manage only the fail block as a bad block.

Figures 9, 10:
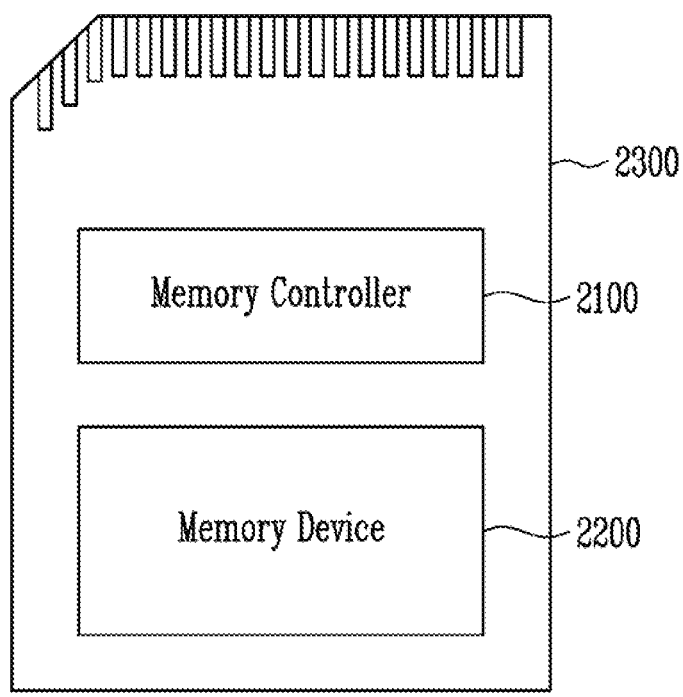
FIG. 9 is a diagram, illustrating an embodiment of shared block information, shown in FIG. 5.
FIG. 10 is a block diagram, illustrating a memory card system to which the storage device is applied, in accordance with an embodiment of the present disclosure.

FIG. 9 is a diagram, illustrating an embodiment of the shared block information 233, shown in FIG. 5.

Referring to FIG. 9, the shared block information 233 may include information on the shared relationship of memory blocks that are included in the memory device 100.

Specifically, the shared block information 233 may include information on a physical address of memory blocks and a physical address of shared blocks of the corresponding memory blocks. The shared block information 233 may be pre-stored in the memory device 100 and then may be loaded by the memory controller when booting up the storage device. When a fail of an operation occurs based on the shared block information 233, the memory controller may manage a fail block and a shared block as bad blocks.

FIG. 10 is a block diagram, illustrating a memory card system to which the storage device is applied, in accordance with an embodiment of the present disclosure.

Referring to FIG. 10, the memory card system 2000 may include a memory controller 2100, a memory device, and a connector 2300.

The memory controller 2100 may be connected to the memory device 2200. The memory controller 2100 may access the memory device 2200. For example, the memory controller 2100 performs read, program, and erase operations of the memory device 2200, or may control a background operation. The memory controller 2100 may be configured to provide an interface between the memory device 2200 and a host. The memory controller 2100 may be configured to driver firmware for controlling the memory device 2200. The memory controller 2100 may be implemented identically to the memory controller 200, described with reference to FIG. 1.

In an example, the memory controller 2100 may include components, such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) based on a specific communication protocol. In an example, the memory controller 2100 may communicate with the external device through at least one of the various communication protocols, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

In an example, the memory controller 2100 or the memory device 2200 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP), to be provided as a single semiconductor package. Alternatively, the memory device 2200 may include a plurality of nonvolatile memory chips, and the plurality of nonvolatile memory chips may be packaged based on the above-described packaging manners to be provided as a single semiconductor package.

In an example, the memory controller 2100 and the memory device 2200 may be integrated as a single semiconductor device. In an example, the memory controller 2100 and the memory device 2200 may be integrated as a single semiconductor device to constitute a Solid State Drive (SSD). The memory controller 2100 and the memory device 2200 may be integrated as a single semiconductor device, to constitute a memory card. For example, the memory controller 2100 and the memory device 2200 may be integrated as a single semiconductor device, to constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

In an example, the memory device 2200 may be the memory device 100 that is described with reference to FIG. 1.

Figure 11:
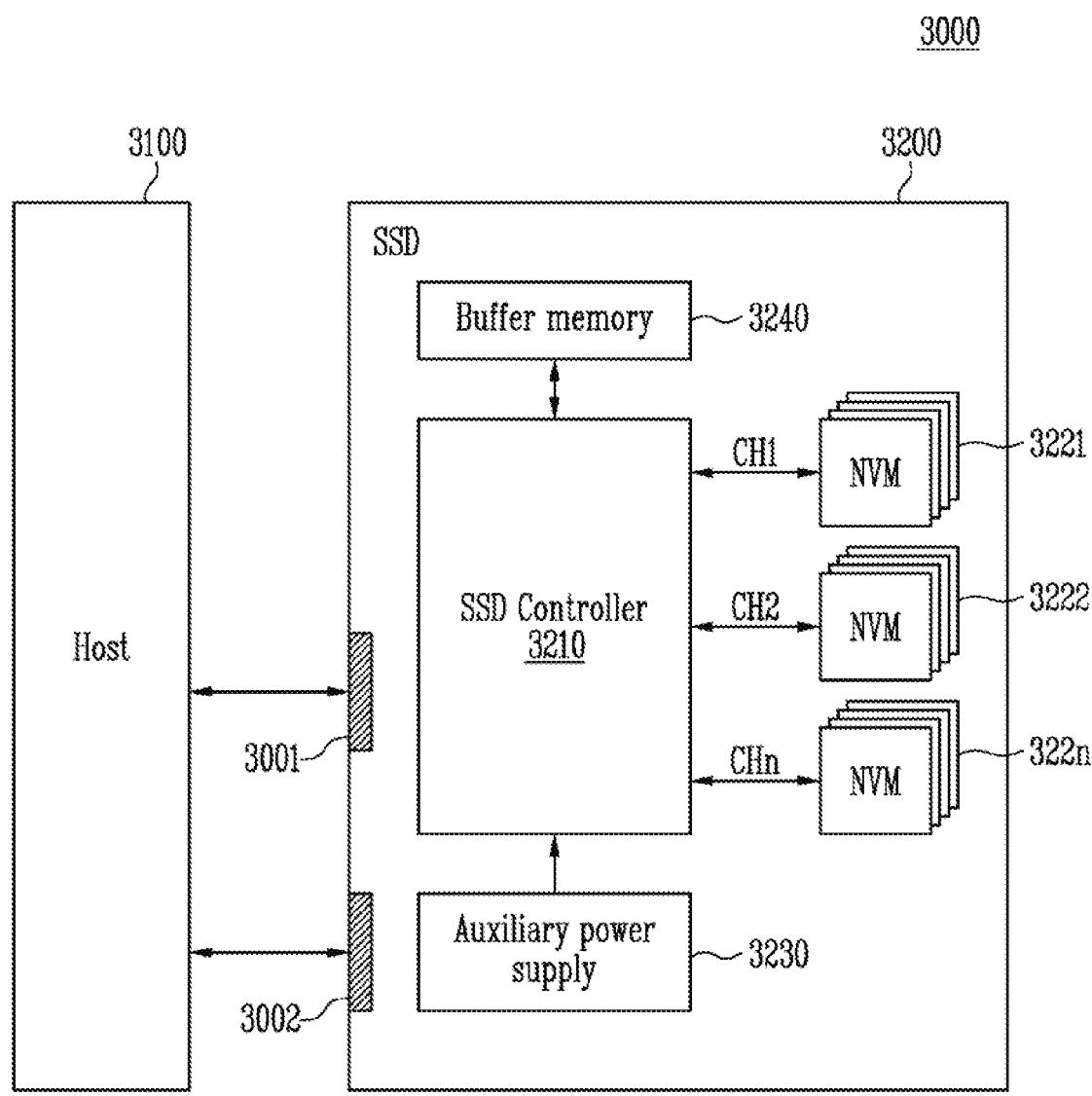
FIG. 11 is a block diagram, exemplarily illustrating a Solid State Drive (SSD) system to which the storage device is applied, in accordance with an embodiment of the present disclosure.

FIG. 11 is a block diagram, exemplarily illustrating a Solid State Drive (SSD) system to which the storage device is applied, in accordance with an embodiment of the present disclosure.

Referring to FIG. 11, the SSD system 3000 may include a host 3100 and an SSD 3200. The SSD 3200 may exchange a signal SIG with the host 3100 through a signal connector 3001, and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may serve as the memory controller 200 that is described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of the interfaces, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 may be connected to the host 3100 through the power connector 3002. When the supply of power from the host 3100 is not smooth, the auxiliary power supply 3230 may provide power of the SSD 3200. In an example, the auxiliary power supply 3230 may be located in the SSD 3200 or may be located at the outside of the SSD 3200. For example, the auxiliary power supply 3230 may be located on a main board and may provide auxiliary power to the SSD 3200.

The buffer memory 3240 may operate as a buffer memory of the SSD 3200. For example, the buffer memory 3240 may temporarily store data that is received from the host 3100 or data that is received from the plurality of flash memories 3221 to 322n, or temporarily store meta data (e.g., a mapping table) of the flash memories 3221 to 322n. The buffer memory 3240 may include volatile memories, such as a DRAM, an SDRAM, a DDR SDRAM, an LPDDR SDRAM, and a GRAM or nonvolatile memories such as a FRAM, a ReRAM, an STT-MRAM, and a PRAM.

In an example, the nonvolatile memories 3221 to 322n may correspond to the memory device 200 that is described with reference to FIG. 1.

Figure 12:
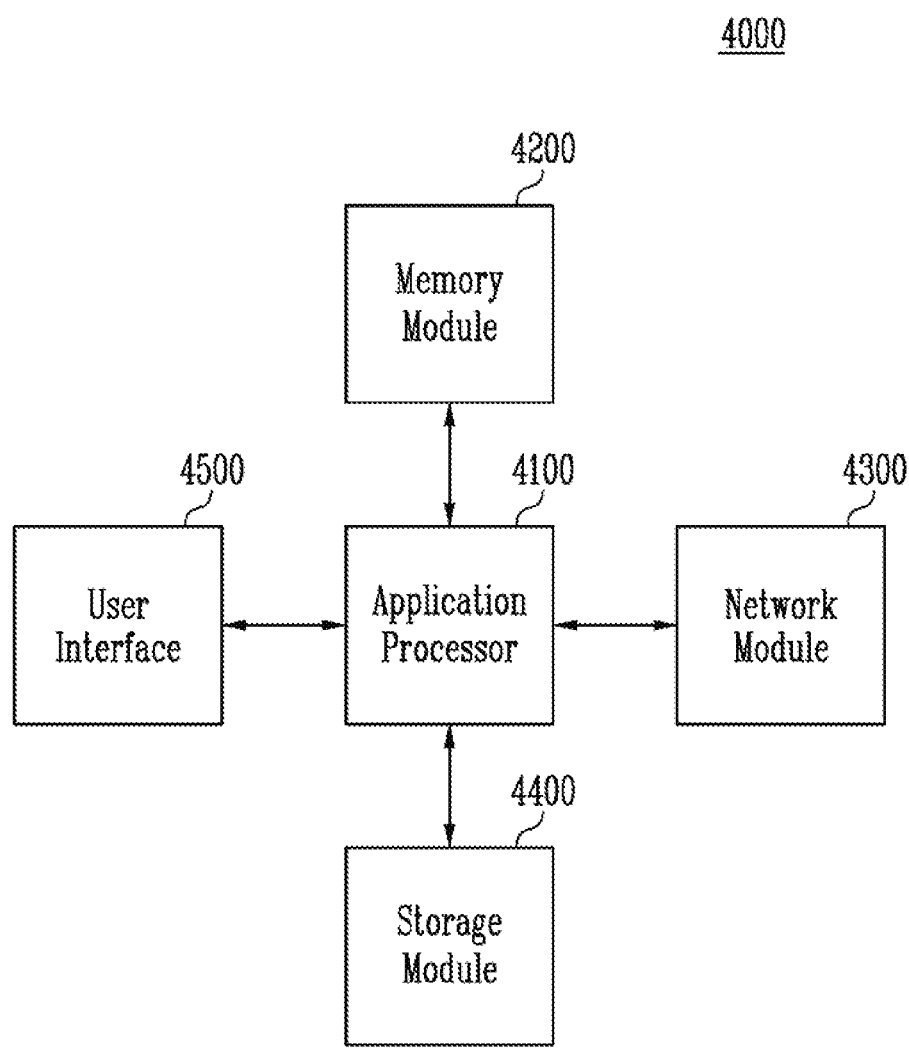
FIG. 12 is a block diagram, illustrating a user system to which the storage device is applied, in accordance with an embodiment of the present disclosure.

FIG. 12 is a block diagram, illustrating a user system to which the storage device is applied, in accordance with an embodiment of the present disclosure.

Referring to FIG. 12, the user system 4000 may include an application processor 4100, a memory module 4200, a network module 4300, a storage module 4400, and a user interface 4500.

The application processor 4100 may drive components that are included in the user system 4000, an operating system (OS), a user program, or the like. In an example, the application processor 4100 may include controllers for controlling components that are included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications, such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data that is received from the application processor 4100. Alternatively, the storage module 4400 may transmit data, stored therein, to the application processor 4100. In an example, the storage module 4400 may be implemented with a nonvolatile semiconductor memory device, such as a Phase-change RAM (PRAM), a Magnetic RAM (MRAM), a Resistive RAM (RRAM), a NAND flash, a NOR flash, or a NAND flash with a three-dimensional structure. In an example, the storage module 4400 may be provided as a removable drive, such as a memory card of the user system 4000 or an external drive.

In an example, the storage module 4400 may include a plurality of nonvolatile memory devices, and the plurality of nonvolatile memory devices may correspond to the memory device 100 described with reference to FIG. 1.

The user interface 4500 may include interfaces for inputting data or commands to the application processor 4100 or outputting data to an external device. In an example, the user interface 4500 may include user input interfaces, such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces, such as a Liquid Crystal Display (LCD), an Organic Light Emitting Diode (OLED) display device, an Active Matrix OLED (AMOLED) display device, an LED, a speaker, and a monitor.

In the storage device and the operating method thereof in accordance with the present disclosure, occurrence of a read fail can be prevented.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A storage device comprising:
   a memory device configured to include a plurality of memory blocks; and
   a memory controller configured to store bad block information including information of a shared block which is associated with a bad block among the plurality of memory blocks in response to an occurrence of the bad block,
   wherein the shared block and the bad block are connected to different word lines, respectively.

2. The storage device of claim 1, wherein the memory device includes:
   a voltage generator configured to generate operating voltages in response to an operation command that is provided by the memory controller;

a block decoder configured to output block select signals respectively corresponding to the plurality of memory blocks based on an address corresponding to the operation command; and a block connector configured to connect global word lines, through which the operating voltages are applied, to local word lines of the memory blocks in response to the block select signals.

3. The storage device of claim 2, wherein the bad block and the shared block are memory blocks that share any one of the block select signal.

4. The storage device of claim 3, wherein the block connector includes sub-connectors respectively corresponding to the plurality of memory blocks.

5. The storage device of claim 4, wherein sub-connectors, respectively corresponding to the bad block and the shared block, are commonly connected to a block word line to which any one of the block select signals is input.

6. The storage device of claim 1, wherein the bad block is a memory block upon which a program operation or an erase operation has failed.

7. The storage device of claim 1, wherein the memory controller includes:

a meta data storage configured to store the bad block information related to bad blocks among the plurality of memory blocks and shared blocks which are associated with the bad blocks, respectively; and a bad block manager configured to control to copy data from the bad blocks and the shared blocks to another memory block and to control the meta data storage to store information related to the bad blocks and the shared blocks in the bad block information.

8. The storage device of claim 7, wherein the meta data storage includes valid data information representing whether data that is stored in the memory device is valid data or invalid data, wherein the bad block manager is configured to control the memory device to store, in the another memory block, valid data that is stored in the bad blocks and the shared blocks, based on the valid data information.

9. The storage device of claim 7, wherein the meta data storage includes mapping information between logical and physical addresses of data that is stored in the memory device, wherein the bad block manager controls to copy the data from the bad blocks and the shared blocks, to another memory block and then update the mapping information.

10. A memory controller for controlling a memory device with a plurality of memory blocks, the memory controller comprising:

a meta data storage configured to store bad block information on a bad block among the plurality of memory blocks; and a bad block manager configured to update the bad block information to include information of a shared block associated with the bad block, wherein the bad block and the shared block are connected to different word lines in the memory device.

11. The memory controller of claim 10, wherein the bad block manager includes:

a bad block controller configured to control the memory device to store, in another memory block, data stored in the bad block and the shared block; and a test program controller configured to control the memory device to erase data in the bad block and to perform a test program operation on the bad block.

12. The memory controller of claim 11, wherein the test program controller controls the meta data storage to store information on the shared block to be included in the bad block information, based on a result obtained by performing the test program operation.

13. The memory controller of claim 11, wherein the test program controller controls the meta data storage to add information on the shared block in the bad block information, based on a number of word lines of which the test program operation has failed among word lines included in the bad block.

14. The memory controller of claim 11, wherein, when a number of word lines of which the test program operation has failed among word lines included in the bad block exceeds a predetermined reference number, the test program controller controls the meta data storage to add information on the bad block and the shared block in the bad block information.

15. The memory controller of claim 11, wherein, when a number of word lines of which the test program operation has failed among word lines included in the bad block is less than or equal to a predetermined reference number, the test program controller controls the meta data storage to add information on the bad block included in the bad block information.

16. A storage device comprising:

a memory device configured to include a plurality of memory blocks, configured to perform an operation corresponding to a received operation command on a first memory block among the plurality of memory blocks, and configured to output a result that is obtained by performing the operation; and a memory controller configured to selectively store bad block information including information of a second memory block which is associated with the first memory block among the plurality of memory blocks according to a number of memory cells of which the operation has failed in the first memory block.

17. The storage device of claim 16, wherein the operation is a program operation or an erase operation.

* * * * *